United States Patent
Goh

(10) Patent No.: US 8,502,394 B2
(45) Date of Patent: Aug. 6, 2013

(54) MULTI-STACKED SEMICONDUCTOR DICE SCALE PACKAGE STRUCTURE AND METHOD OF MANUFACTURING SAME

(75) Inventor: Kim-Yong Goh, Singapore (SG)

(73) Assignee: STMicroelectronics Pte Ltd., Singapore (SG)

( * ) Notice: Subject to any disclaimer, the term of this patent is extended or adjusted under 35 U.S.C. 154(b) by 560 days.

(21) Appl. No.: 12/651,080

(22) Filed: Dec. 31, 2009

(65) Prior Publication Data

US 2011/0156230 A1 Jun. 30, 2011

(51) Int. Cl.
H01L 23/48 (2006.01)
(52) U.S. Cl.
USPC .......................................... 257/777
(58) Field of Classification Search
USPC ......... 257/685–686, 737–738, 777, 778–781, 257/E25.013, E23.169
See application file for complete search history.

(56) References Cited

U.S. PATENT DOCUMENTS

| | | | |
|---|---|---|---|
| 4,603,374 A | 7/1986 | Wasielewski | |
| 4,715,115 A | 12/1987 | King et al. | |
| 5,222,014 A | 6/1993 | Lin | |
| 5,309,011 A | 5/1994 | Tazunoki et al. | |
| 5,355,580 A | 10/1994 | Tsukada | 29/840 |
| 5,488,200 A | 1/1996 | Tsukada | 174/261 |
| 5,936,843 A | 8/1999 | Ohshima et al. | |
| 6,253,992 B1 | 7/2001 | Fjelstad | |
| 6,271,469 B1 | 8/2001 | Ma et al. | |
| 6,344,682 B1 | 2/2002 | Tomita | |
| 6,350,668 B1 | 2/2002 | Chakravorty | 438/612 |
| 6,680,529 B2 | 1/2004 | Chen et al. | |
| 6,717,245 B1 | 4/2004 | Kinsman et al. | 257/678 |
| 6,828,665 B2 | 12/2004 | Pu et al. | |
| 6,882,054 B2 | 4/2005 | Jobetto | |
| 6,940,169 B2 | 9/2005 | Jin et al. | |
| 7,045,899 B2 | 5/2006 | Yamane et al. | |
| 7,067,911 B1 | 6/2006 | Lin et al. | |
| 7,141,873 B2 | 11/2006 | Aoyagi | |
| 7,193,301 B2 | 3/2007 | Yamaguchi | |
| 7,489,032 B2 | 2/2009 | Jobetto | |
| 7,714,453 B2 | 5/2010 | Khan et al. | |
| 7,772,687 B2 | 8/2010 | Inoue | |
| 7,871,861 B2 | 1/2011 | Song et al. | |

(Continued)

OTHER PUBLICATIONS

Goh et al., "Fan-Out Wafer Level Package for an Optical Sensor and Method of Manufacture Thereof," U.S. Appl. No. 12/651,304, filed Dec. 31, 2009, 27 pages.

(Continued)

*Primary Examiner* — Hoa B Trinh
(74) *Attorney, Agent, or Firm* — Seed IP Law Group PLLC

(57) ABSTRACT

A multi-stack semiconductor dice assembly has enhanced board-level reliability and integrated electrical functionalities over a common package foot-print. The multi-stack semiconductor dice assembly includes a bottom die having a stepped upper surface. The stepped upper surface includes a base region and a stepped region, which is raised relative to the base region. The base region includes a plurality of attachment structures that are sized and shaped to receive electrically conductive balls. An upper die is stacked above the bottom die. The upper die includes a plurality of attachment structures that are sized and shaped to receive electrically conductive balls and are arranged to align with the attachment structures of the bottom die. Electrically conductive balls are attached to the attachment structures of the bottom die and the attachment structures of the upper die.

19 Claims, 11 Drawing Sheets

U.S. PATENT DOCUMENTS

| | | | |
|---|---|---|---|
| 7,989,707 | B2 | 8/2011 | Yamano et al. |
| 8,003,496 | B2 | 8/2011 | Oh et al. |
| 8,004,092 | B2 | 8/2011 | Lin et al. |
| 8,106,495 | B2 | 1/2012 | Kajiki |
| 8,125,066 | B1 | 2/2012 | Kang |
| 8,158,888 | B2 | 4/2012 | Shen et al. |
| 2002/0070443 | A1 | 6/2002 | Mu et al. |
| 2004/0033643 | A1 | 2/2004 | Odegard et al. |
| 2004/0075164 | A1 | 4/2004 | Pu et al. |
| 2005/0041134 | A1 | 2/2005 | Takayama |
| 2005/0121764 | A1 | 6/2005 | Mallik et al. |
| 2005/0146051 | A1 | 7/2005 | Jobetto |
| 2005/0161823 | A1 | 7/2005 | Jobetto et al. |
| 2006/0091521 | A1* | 5/2006 | Cady et al. .................. 257/686 |
| 2006/0256222 | A1 | 11/2006 | Tsai |
| 2007/0090508 | A1 | 4/2007 | Lin et al. |
| 2007/0181989 | A1 | 8/2007 | Corisis et al. |
| 2008/0017968 | A1 | 1/2008 | Choi et al. |
| 2008/0083988 | A1 | 4/2008 | Lin |
| 2008/0157329 | A1 | 7/2008 | Inoue |
| 2009/0057895 | A1 | 3/2009 | Lin et al. |
| 2009/0127688 | A1 | 5/2009 | Lee et al. |
| 2009/0212412 | A1 | 8/2009 | Yoon |
| 2009/0322437 | A1 | 12/2009 | Avni et al. |
| 2010/0072600 | A1* | 3/2010 | Gerber ........................ 257/686 |
| 2010/0090323 | A1* | 4/2010 | Shinoda et al. ............. 257/686 |
| 2010/0117212 | A1 | 5/2010 | Corisis et al. |
| 2010/0148316 | A1 | 6/2010 | Kim et al. |
| 2010/0244263 | A1 | 9/2010 | Lin et al. |
| 2011/0024905 | A1 | 2/2011 | Lin et al. |
| 2011/0032400 | A1 | 2/2011 | Yang |
| 2011/0156230 | A1 | 6/2011 | Goh |
| 2011/0156240 | A1 | 6/2011 | Luan et al. |
| 2011/0156250 | A1 | 6/2011 | Goh et al. |
| 2011/0157452 | A1 | 6/2011 | Goh et al. |
| 2011/0157853 | A1 | 6/2011 | Goh |
| 2011/0260303 | A1 | 10/2011 | Pagaila et al. |
| 2011/0278717 | A1 | 11/2011 | Pagaila et al. |
| 2011/0291274 | A1 | 12/2011 | Meyer et al. |
| 2011/0316146 | A1 | 12/2011 | Pagaila et al. |
| 2011/0316156 | A1 | 12/2011 | Pagaila et al. |
| 2012/0049364 | A1 | 3/2012 | Sutardja et al. |

OTHER PUBLICATIONS

Goh, "Fan-Out Wafer Level Package With Polymeric Layer for High Reliability," U.S. Appl. No. 12/651,295, filed Dec. 31, 2009, 31 pages.

Goh et al., "Flip-Chip Fan-Out Wafer Level Package for Package-on-Package Applications, and Methods of Manufacture," U.S. Appl. No. 12/651,365, filed Dec. 31, 2009, 20 pages.

Luan et al., "Reliable Large Die Fan-Out Wafer Level Package and Method of Manufacture," U.S. Appl. No. 12/651,362, filed Dec. 31, 2009, 27 pages.

ASE Tech Forum, "ASE PoP (TRD PoP & MAP PoP)," The Advanced Semiconductor Engineering Ground, Sep. 2007, 37 pages.

Chua et al., "Method for Producing Vias in Fan-Out Wafers Using Dry Film and Conductive Paste, and a Corresponding Semiconductor Package," U.S. Appl. No. 12/977,697, filed Dec. 23, 2010, 34 pages.

Jin, "Apparatus and Method for Placing Solder Balls," U.S. Appl. No. 13/340,275, filed Dec. 29, 2011, 31 pages.

Johnson, "STATS ChipPAC Expands eWLB to Reconstituted 300 mm Wafers," *Semiconductor International*, published Apr. 15, 2010, downloaded from http://english.ime.cas.cn/ns/es/201004/t20100429_53569.html, which was published by Microelectronice of Chinese Academy of Sciences, 2007, 2 pages.

Goh, "Fan-Out Wafer Level Package with Polymeric Layer for High Reliability," U.S. Appl. No. 12/649,130, filed Dec. 29, 2009, 30 pages.

* cited by examiner

MULTI-STACKED SEMICONDUCTOR DICE SCALE PACKAGE STRUCTURE AND METHOD OF MANUFACTURING SAME

BACKGROUND

1. Technical Field

This disclosure generally relates to stacked semiconductor devices and more particularly to multi-stacked semiconductor dice with enhanced board-level reliability and integrated electrical functionalities over a common package foot-print.

2. Description of the Related Art

Multi-stack semiconductor structures include laminate Ball Grid Array (BGA) structures and Three Dimensional (3D) Integrated Circuits. Laminate BGA structures include semiconductor dice and at least one laminate substrate. In a laminate BGA structure, a first semiconductor die includes a bottom surface to be attached to a circuit board and an upper surface. The upper surface of the first semiconductor die is attached to one side of a laminate substrate through solder joints. An opposed side of the laminate substrate is attached to a bottom surface of a second semiconductor die through solder joints. Laminate BGA structures can be extended to more two levels by adding more laminate substrates and semiconductor dice. For example, a third semiconductor die may be stacked thereon with an additional laminate substrate connecting the second and third semiconductor dice together.

A problem with laminate BGA structures is that the laminates interposing adjacent semiconductor dice add to the overall height of the package. In some applications, it may be desirable to reduce the overall height of the package.

Three Dimensional (3D) Integrated Circuits (IC) have multiple integrated circuits stacked one on top of the other. In 3D IC structures one integrated circuit is connected to an adjacent integrated circuit by through-silicon vias that create vertical connections through the body of the die. These structures are complex to manufacture.

Multi-stack semiconductor structures are increasing in functionality and complexity. A consequence of the increased functionality is that the multi-stack semiconductor structures are increasing in size and have a larger foot-print on a circuit board. There are problems with merely increasing the foot-print size of the multi-stack semiconductor structure to provide additional functionality. For example, it may be desired to reduce the overall size of the circuit board, and in that case, it may not be desirable to increase the size of the foot-print of the multi-stack semiconductor structure.

BRIEF SUMMARY

A multi-stack semiconductor dice assembly with enhanced board-level reliability and integrated electrical functionalities over a common package foot-print is disclosed. The multi-stack semiconductor dice assembly includes a bottom die having a stepped upper surface. The stepped upper surface includes a base region and a stepped region, which is raised relative to the base region. The base region includes a plurality of attachment structures that are sized and shaped to receive electrically conductive balls. An upper die is stacked above the bottom die. The upper die includes a plurality of attachment structures that are sized and shaped to receive electrically conductive balls and are arranged to align with the attachment structures of the bottom die. Electrically conductive balls are attached to the attachment structures of the bottom die and the attachment structures of the upper die.

In one embodiment, a multi-stack semiconductor dice assembly includes a first semiconductor die, a second semiconductor die, and a plurality of electrically conductive balls. The first semiconductor die has at least one integrated circuit therein and has opposed upper and bottom surfaces. The bottom surface of the first semiconductor die has a first plurality of contact pads. The second semiconductor die has a bottom surface and an opposed stepped upper surface. The stepped upper surface includes a base region and a stepped region that is generally raised with respect to the base region, and the stepped region has a generally planar surface parallel to a surface of the bottom surface of the second semiconductor die. The base region of the second semiconductor die has plurality of attachment structures. The second semiconductor die has at least one integrated circuit therein. Each electrically conductive ball of the plurality of electrically conductive balls extends between and adheres to a respective contact pad of the bottom surface of the first semiconductor die and a respective attachment structure of the first region of the second semiconductor die.

BRIEF DESCRIPTION OF THE SEVERAL VIEWS OF THE DRAWING(S)

In the drawings, identical reference numbers identify identical elements or elements in the same group and class. The sizes and relative positions of elements in the drawings are not necessarily drawn to scale. For example, the shapes of various elements and angles are not necessarily drawn to scale, and some of these elements are enlarged and positioned to improve drawing legibility. Further, the particular shapes of the elements as drawn do not necessarily convey any information regarding the actual shape of the particular elements and some features may be enlarged or modified for ease of recognition in the drawings.

DETAILED DESCRIPTION OF THE INVENTION

In the following description, certain specific details are set forth in order to provide a thorough understanding of various disclosed embodiments. Various embodiments may be practiced without one or more of these specific details, or with other methods, components, materials, etc. Well-known structures associated with fabrication of semiconductor devices have not been shown or described in detail to avoid unnecessarily obscuring descriptions of the preferred embodiments.

Unless the context requires otherwise, throughout the specification and claims which follow, the word "comprise" and variations thereof, such as, "comprises" and "comprising" are to be construed in an open, inclusive sense, for example "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. The term "or" is generally employed in its sense including "and/or" unless the content clearly dictates otherwise.

The headings and Abstract of the Disclosure provided herein are for convenience only and do not interpret the scope or meaning of the embodiments.

Figure 1A:
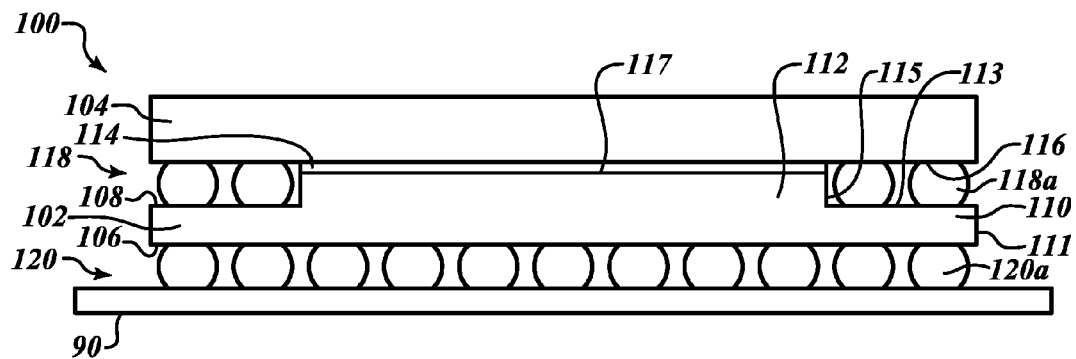
FIG. 1A is a schematic cross sectional side view of a multi-stack semiconductor dice assembly connected to a circuit board, according to one embodiment.
Figure 1B:
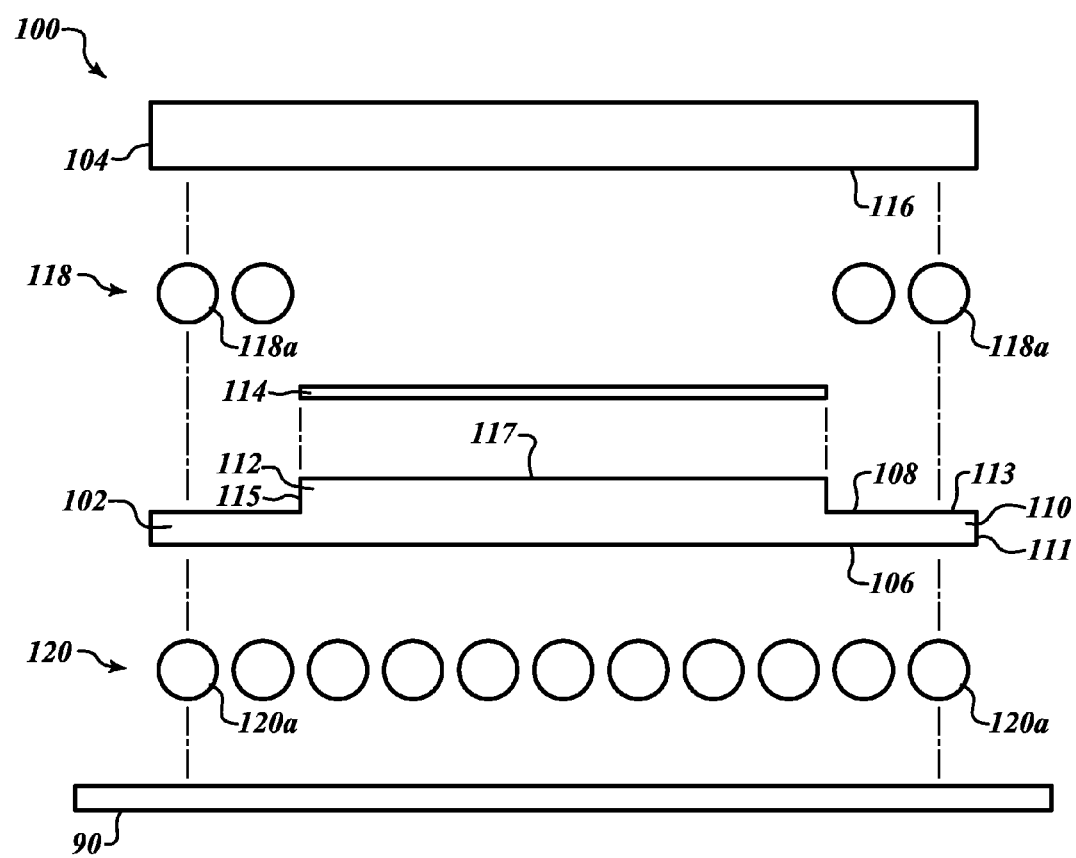
FIG. 1B is an exploded schematic cross sectional side view of the multi-stack semiconductor dice assembly and the circuit board of FIG. 1A.

FIG. 1A shows a schematic cross sectional side view of a multi-stack semiconductor dice assembly 100 connected to a circuit board 90, and FIG. 1B shows an exploded schematic cross sectional side view of the multi-stack semiconductor dice assembly 100 and circuit board 90. The circuit board 90 may be a conventional printed circuit board. The multi-stack semiconductor dice assembly 100 is illustrated as having a generally square foot-print with respect to the circuit board 90. However, the multi-stack semiconductor dice assembly 100 is not limited to such shape. The size and shape of the multi-stack semiconductor dice assembly 100 may be a matter of design choice. Further, the multi-stack semiconductor dice assembly 100 is illustrated and described in one embodiment as being a two level stack, but multi-stack semiconductor dice assembly assemblies are not limited to being two level stacks.

The multi-stack semiconductor dice assembly 100 includes a bottom semiconductor die 102 and an upper semiconductor die 104. The bottom semiconductor die 102 and the upper semiconductor die 104 may be manufactured in accordance with standard semiconductor fabrication techniques from silicon wafers. Typically, the semiconductor dice 102 and 104 are made from silicon wafers, and the circuit board 90 is made from a different material. Consequently, properties such as thermal characteristics (e.g., thermal expansion and contraction) and mechanical properties (e.g., elasticity, stiffness and rigidity) of the circuit board 90 will typically be different from those of the semiconductor dice 102 and 104. Typically, the circuit board 90 will be less stiff and less rigid than the semiconductor dice 102 and 104.

The upper semiconductor die 104 is stacked above and overlaps the bottom semiconductor die 102. In some embodiments, the bottom semiconductor die 102 and the upper semiconductor die 104 may be stacked such that the upper semiconductor die 104 generally superposes the bottom semiconductor die 102. In some embodiments, multi-stack semiconductor dice assembly 100 may include one or more additional semiconductor dice (see FIG. 9) interposing the bottom semiconductor die 102 and the upper semiconductor die 104.

The bottom semiconductor die 102 may be a flip-chip having a bottom surface 106 that is generally planar and a stepped upper surface 108. The bottom surface 106 is an active face of the bottom semiconductor die 102 and has electrical circuits and electrical components such as transistors, diodes, memory cells, etc., formed in proximity to the bottom surface 106. When the integrated circuit is being constructed, this is also referred to as the front face, top face, etc.

The stepped upper surface 108 is a non-active face of the bottom semiconductor die 102 often termed the backside of the die. The upper surface 108 includes a base region 110 and a step region 112. The base region 110 has at least one outer peripheral wall 111 and an upper surface 113 that may be generally planar. The at least one outer peripheral wall 111 defines a shape or foot-print of the bottom semiconductor die 102 and a first height ($h_1$) between the bottom surface 106 and the upper surface 108 of the base region.

The stepped region 112 has at least one outer wall 115 and an upper surface 117 that may be generally planar. The upper surface 117 is raised with respect to the upper surface 113 of base region 110 by a second height ($h_2$). The at least one outer wall 115 extends between the upper surface 113 of the base region 110 and the upper surface 117 of the stepped region 112. In some embodiments, the first height ($h_1$) and the second height ($h_2$) are approximately the same.

The upper surface 113 of the base region 110 and the upper surface 117 of the stepped region 112 may be generally parallel with respect to each other. Similarly, the upper surface 113 of the base region 110, the upper surface 117 of the stepped region 112 and the bottom surface 106 may be generally parallel with respect to each other.

The bottom semiconductor die 102 is manufactured in accordance with known semiconductor processing techniques. The bottom semiconductor die 102 is formed from a single wafer and the base region 110 and the stepped region 112 are a single body, integrally formed.

The multi-stack semiconductor dice assembly 100 may also include a thermal interface material 114. The thermal interface material 114 is disposed between the stepped region 112 of the bottom semiconductor die 102 and a portion of a bottom surface 116, which may be generally planar, of the top semiconductor die 104. The thermal interface material 114 thermally connects the bottom semiconductor die 102 and the top semiconductor die 104 and may be a material such as thermal grease or adhesive material. The bottom surface 116 of the top semiconductor die 104 is generally parallel to the upper surface 117 of the stepped region 112 and the thermal interface material 114 is approximately of uniform thickness.

A first plurality of electrically conductive balls 118 extend between the base region 110 of the upper surface 108 of the bottom semiconductor die 102 and the bottom surface 116 of the upper semiconductor die 104. The electrically conductive balls 118 may be solder balls, or the like, and may be solder-ball mounted to the base region 110 of the bottom semiconductor die 102 and the bottom surface 116 of the upper semiconductor die 104. The electrically conductive balls 118 may be fused to the base region 110 of the bottom semiconductor die 102 and the bottom surface 116 of the upper semiconductor die 104 by a reflow process. The electrically conductive balls 118 attach the bottom semiconductor die 102 and the upper semiconductor die 104 together, and at least some, but not necessarily all, of the electrically conductive balls 118 may be used to provide an electrical path between the bottom semiconductor die 102 and the upper semiconductor die 104.

A second plurality of electrically conductive balls 120 extend downward from the bottom surface 106 of the bottom semiconductor die 102. The electrically conductive balls 120 may be solder balls, or the like, and may be solder-ball mounted to the bottom surface 106 of the bottom semiconductor die 102. The electrically conductive balls 120 may be fused to the bottom surface 106 of the bottom semiconductor die 102 by a reflow process.

The second plurality of electrically conductive balls 120 attach the multi-stack semiconductor dice assembly 100 to the circuit board 90. At least some, but not necessarily all, of the electrically conductive balls 120 may be used to provide an electrical path between the circuit board 90 and semiconductor dice 102 and 104 of the multi-stack semiconductor dice assembly 100.

The electrically conductive balls 120 that are not used to provide an electrical path between the circuit board 90 and semiconductor dice 102 and 104 of the multi-stack semiconductor dice assembly 100 may be referred to as "dummy balls." The presence of dummy balls provides additional attachment points between the circuit board 90 and the multi-stack semiconductor dice assembly 100. As described in detail herein below, dummy balls may be generally located at or proximal to peripheral edges the multi-stack semiconductor dice assembly 100, and in particular, dummy balls may be located at or near peripheral corners of the multi-stack semiconductor dice assembly 100. The functionality of the multi-stack semiconductor dice assembly 100 is not affected if attachments between the circuit board 90 and dummy balls are broken or if the dummy balls develop cracks. (Cracks in electrically conductive balls may result from stresses and strains placed on them because of the different properties of the circuit board 90 and the semiconductor dice 102 and 104.)

Figure 2A:
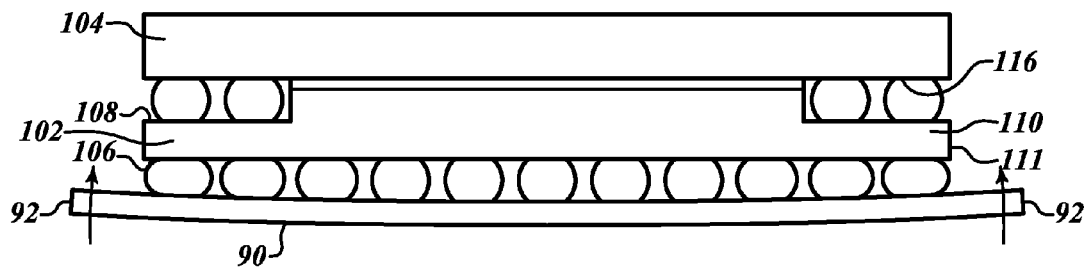
FIGS. 2A and 2B are schematic cross sectional side views the multi-stack semiconductor dice assembly and the circuit board of FIG. 1A, where the circuit board 90 is in deformed states.
Figure 2B:
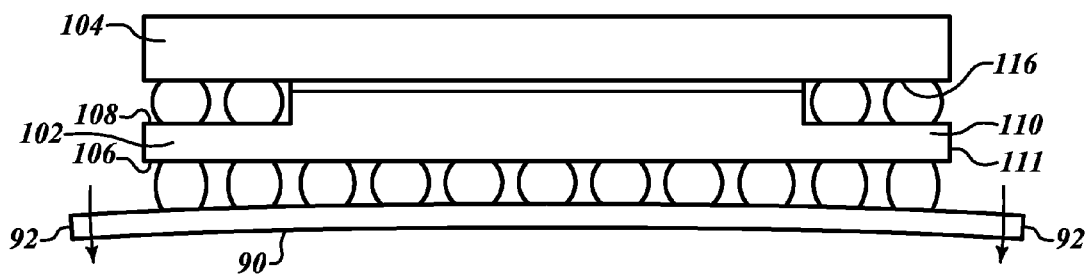

FIGS. 2A and 2B show schematic cross sectional side views the multi-stack semiconductor dice assembly 100 and the circuit board 90 in which the circuit board 90 is in various deformed states. In FIG. 2A, opposed ends 92 of the circuit board 90 are bent downward, and in FIG. 2B opposed ends 92 of the circuit board 90 are bent upward.

FIGS. 2A and 2B show deformations of the circuit board 90 that may be caused by an impact such as the circuit board 90 being dropped and impacting a rigid object (not shown). Since the semiconductor dice 102 and 104 are rigid and stiff relative to the circuit board 90, the inflexibility of the semiconductor dice 102 and 104 to bend in conformance with deformations of the circuit board 90 result in stresses in the electrically conductive balls 120. Peripheral electrically conductive balls 120c are subject to higher stress than inner electrically conductive balls 120d, and consequently, the peripheral electrically conductive balls 120c are deformed more than the inner electrically conductive balls 120d.

Due to stiffness and rigidity of the bottom semiconductor die 102, the bottom semiconductor die 102 is not deformed, at least to an appreciable amount relative to the deformation of the circuit board 90. Consequently, the electrically conductive balls 118 are not subject to stress or strain caused by the deformation of the circuit board 90.

Figure 3:
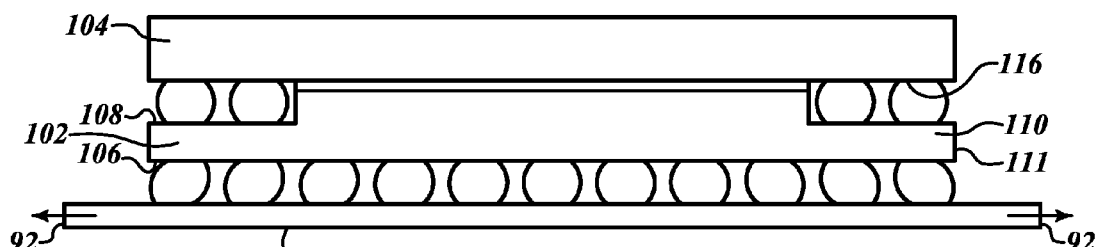
FIG. 3 is a schematic cross sectional side view of the multi-stack semiconductor dice assembly and the circuit board of FIG. 1A during thermal cycling.

FIG. 3 shows a schematic cross sectional side view of the multi-stack semiconductor dice assembly 100 and the circuit board 90 during thermal cycling. Due to the different thermal characteristics of the circuit board 90 and semiconductor dice 102 and 104, they expand and contract by differing amounts. Typically, the semiconductor dice 102 and 104 expand and contract at a much slower rate than the circuit board 90. The differing rates of thermal expansion and thermal contraction result in peripheral electrically conductive balls 120c being subjected to higher shear stress and plastic work accumulation than inner electrically conductive balls 120d.

Semiconductor dice 102 and 104 are both fabricated from semiconductor wafers and have the same, or very similar, thermal characteristics. The semiconductor dice 102 and 104 expand and contract at a amount that is essentially the same, at least in comparison to the rate of expansion and contraction of the circuit board. Consequently, the electrically conductive balls 118 are not subject to stress or strain caused by differing rates of thermal expansion and contraction.

Some, but not necessarily all, of the electrically conductive balls 120c are "dummy balls." The functionality of the multi-stack semiconductor dice assembly 100 is not degraded if the "dummy balls" are cracked or no longer bonded to both the bottom semiconductor die 102 and the circuit board 90.

Figure 4A:
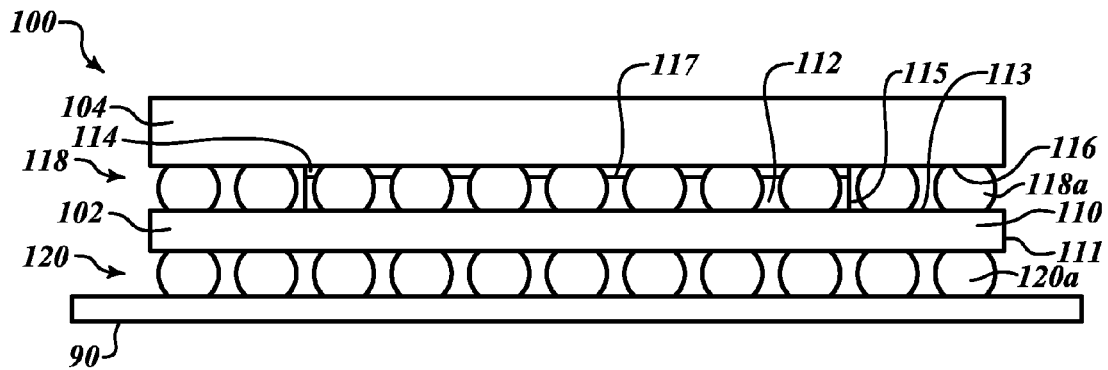
FIG. 4A is a schematic side view of the multi-stack semiconductor dice assembly connected to a circuit board of FIG. 1A, according to one embodiment.

FIG. 4A is a schematic side view of the multi-stack semiconductor dice assembly 100, in final form, connected to the circuit board 90. FIG. 4A shows that there are peripheral electrically conductive balls between the outer peripheral wall 111 of the base region 110 and the peripheral wall 115 of the stepped region 112. However, in some embodiments, at least a portion of the peripheral wall 111 of the base region 110 and the peripheral wall 115 of the stepped region 112 may be vertically aligned.

Figure 4B:
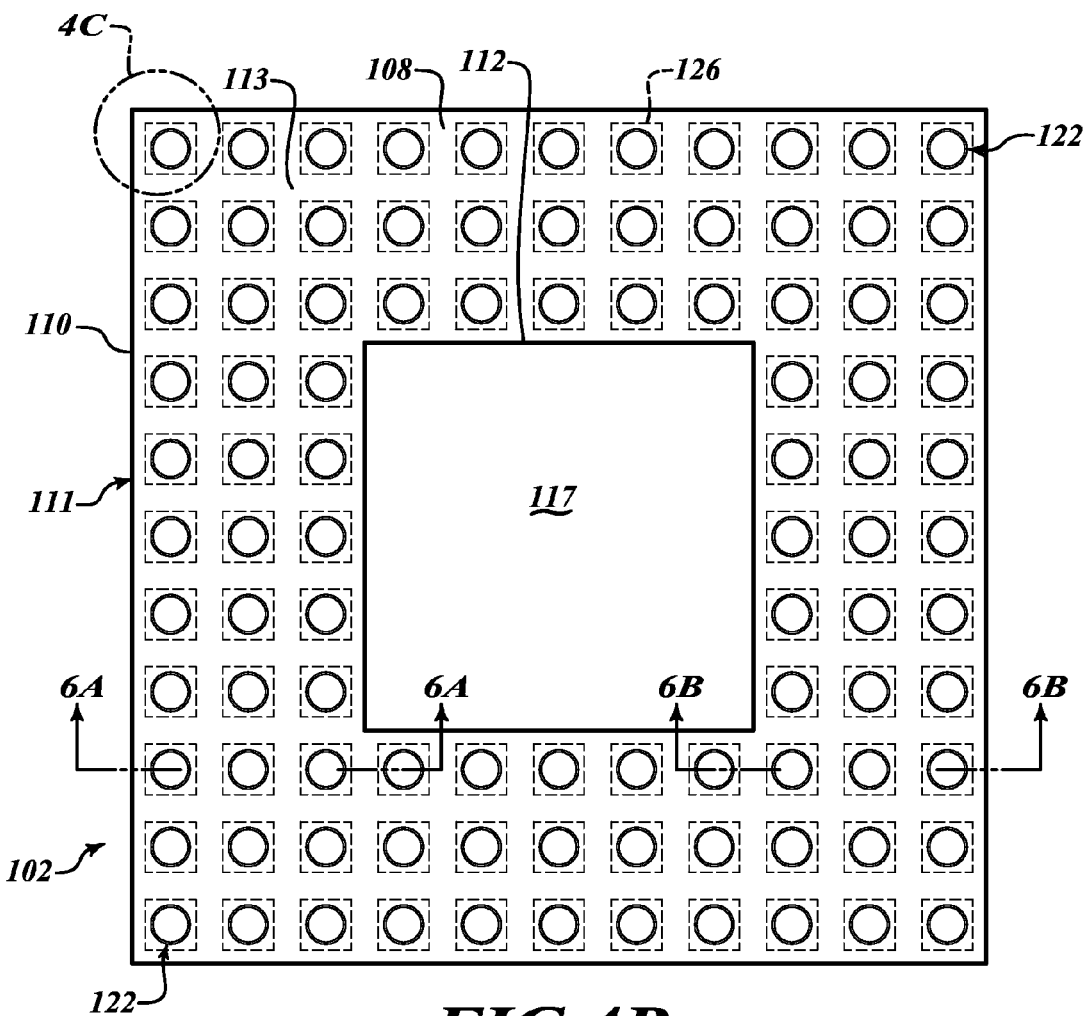
FIG. 4B is a schematic top view of a bottom semiconductor die of the multi-stack semiconductor dice assembly of FIG. 4A, according to one illustrated embodiment.
Figure 4C:
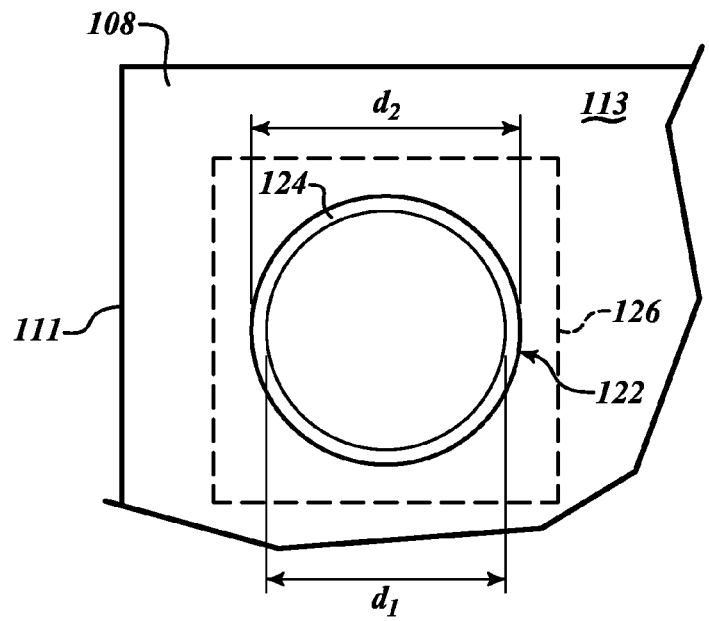
FIG. 4C is an enlarged portion of the section labeled 4C in FIG. 4B.
Figure 4D:
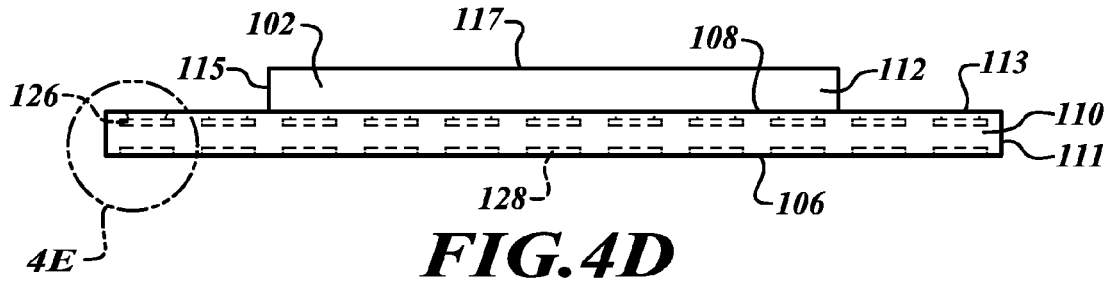
FIG. 4D is a schematic side view of the bottom semiconductor die of FIG. 4A, according to one embodiment.
Figure 4E:
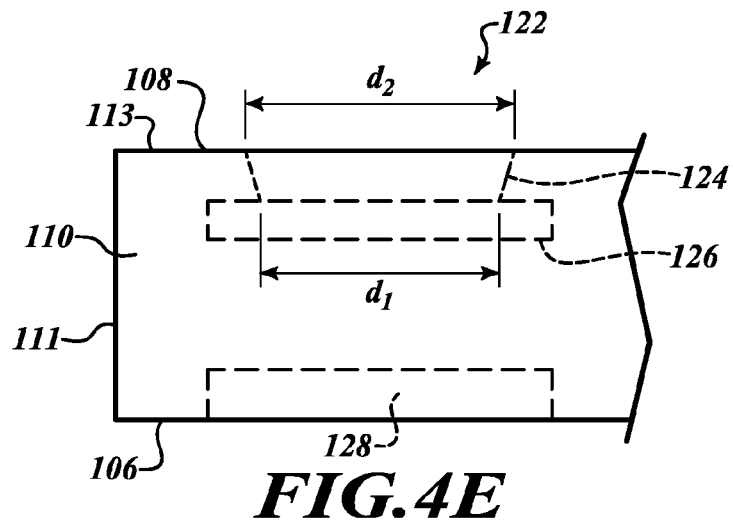
FIG. 4E is an enlarged portion of the section labeled 4E in FIG. 4D.
Figure 4F:
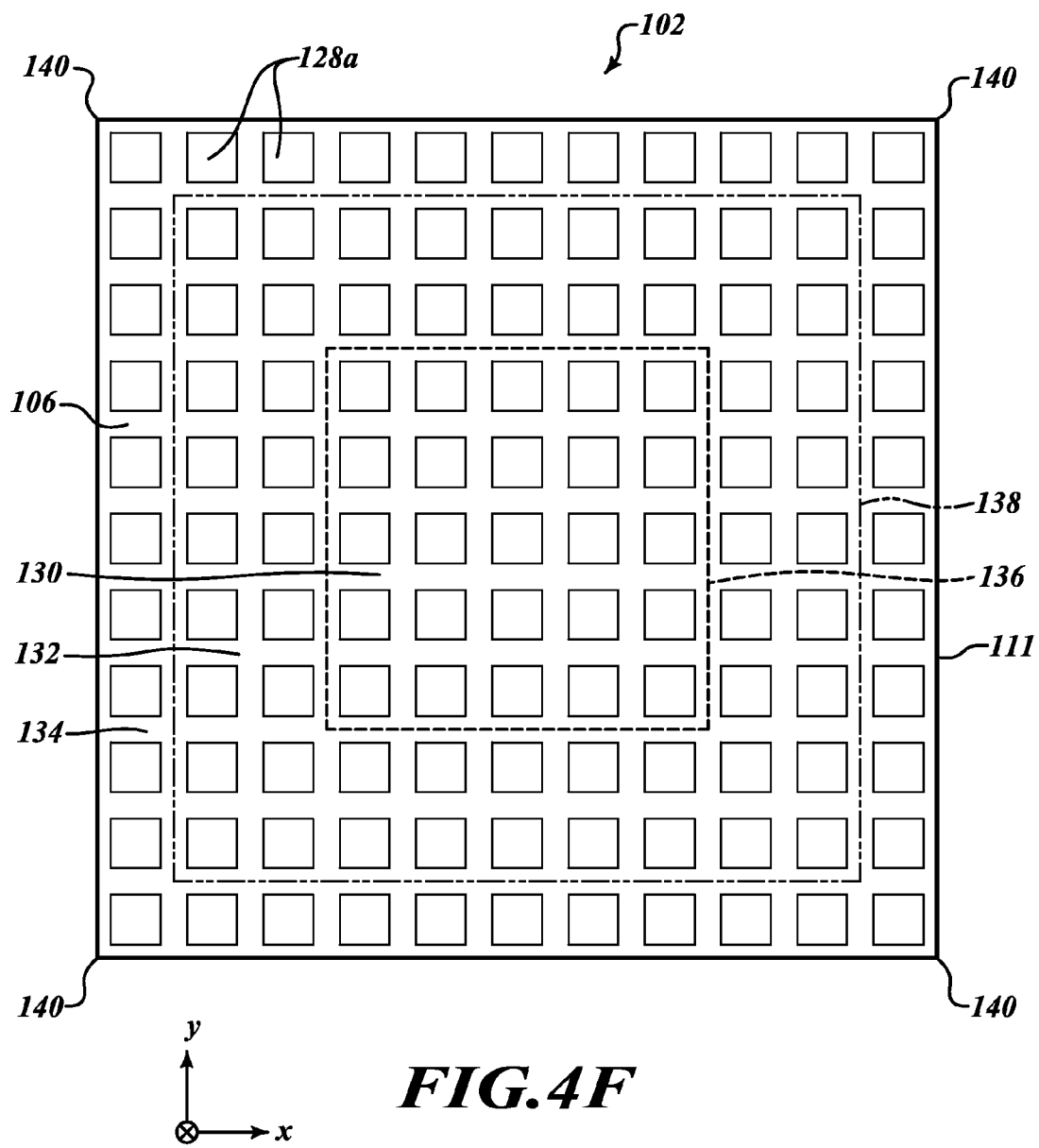
FIG. 4F is a schematic bottom view of the bottom semiconductor die of FIG. 4A, according to one embodiment.

FIGS. 4B, 4D and 4F show a schematic top view, a schematic side view, and a bottom view of the bottom semiconductor die 102, respectively. FIG. 4C shows an enlarged portion of FIG. 4B, and FIG. 4E shows an enlarged portion of FIG. 4D.

Referring to FIGS. 4B-4E, the upper surface 108 has a plurality of attachment structures or attachment openings 122 formed therein, extending inward from the upper surface 113 of the base region 110 toward the bottom surface 106. The attachment openings 122 are generally circular in cross sectional shape and are shown as having a chamfered side wall 124. The attachment openings 122 may have a lower diameter ($d_1$) and an upper diameter ($d_2$), where the lower diameter ($d_1$) is smaller than the upper diameter d2. In some embodiments, the side wall 124 may be generally vertically aligned such that upper and lower diameters are approximately the same size.

The attachment openings 122 at least partially expose a first plurality of contact pads 126. The contact pads 126 are made from an electrically conductive material such as, but not limited to, copper, aluminum, tungsten, etc. At least a portion of the contact pads 126 remains unexposed under the upper surface 113 of the base region 110. Each respective attachment opening 122 is sized and shaped to receive at least a portion of one of electrically conductive balls 118, and the received electrically conductive ball 118 is attached to the contact pad 126 exposed by the respective attachment opening 122. Typically, the electrically conductive balls 118 may be soldered to the contact pads 126.

Referring to FIGS. 4D-4F, the bottom surface 106 has a second plurality of contact pads 128. The contact pads 128 are made from an electrically conductive material such as, but not limited to, copper, aluminum, tungsten, etc. Each respective contact pad 128 is sized and shaped to receive at least a portion of one of electrically conductive balls 120 such that the electrically conductive balls 120 may be soldered to the contact pads 128.

Conceptually, the bottom surface 106 of the semiconductor die 102 may be thought of having three regions: an inner region 130, an intermediary region 132 that at least partially circumscribes the inner region 130, and a peripheral region 134 that at least partially circumscribes the intermediary regions 132. Inner dashed box 136 represents a boundary between the inner region 130 and the intermediary region 132. Similarly, outer dashed box 138 represents a boundary between the intermediary region 132 and the peripheral region 134. Contact pads 128 disposed in the different regions 130, 132 and 134 may be used for different purposes.

The contact pads 128 in the inner region 130 and/or the intermediary region 132 may generally form a grid array, which may have a first pitch in one direction, e.g., X direction, and the same or different pitch in another direction, e.g., Y direction. In some embodiments, the contact pads 128 in the inner region 130 and/or the intermediary region 132 might arranged such that they do not form a grid array.

Figure 6A:
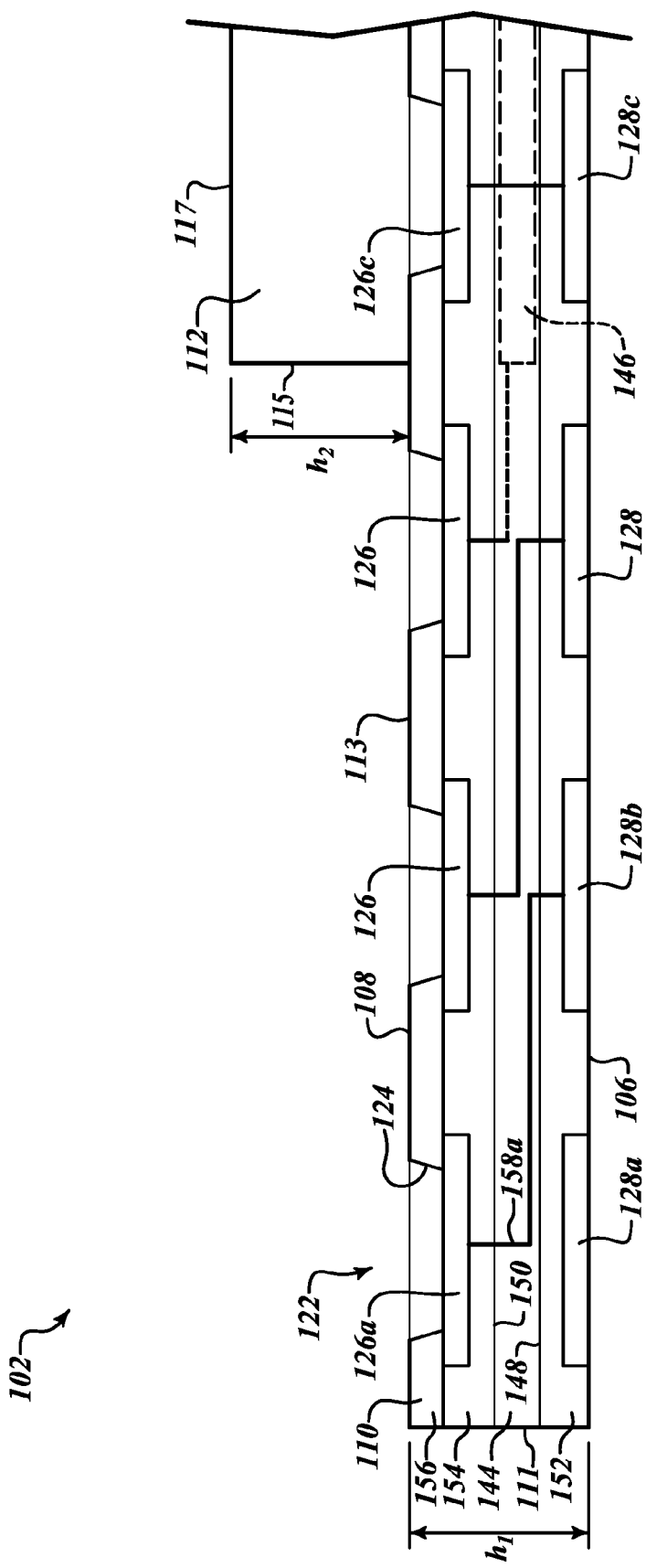
FIGS. 6A and 6B are schematic cross sectional views of the bottom semiconductor die of FIG. 4B, according to one illustrated embodiment.
Figure 6B:
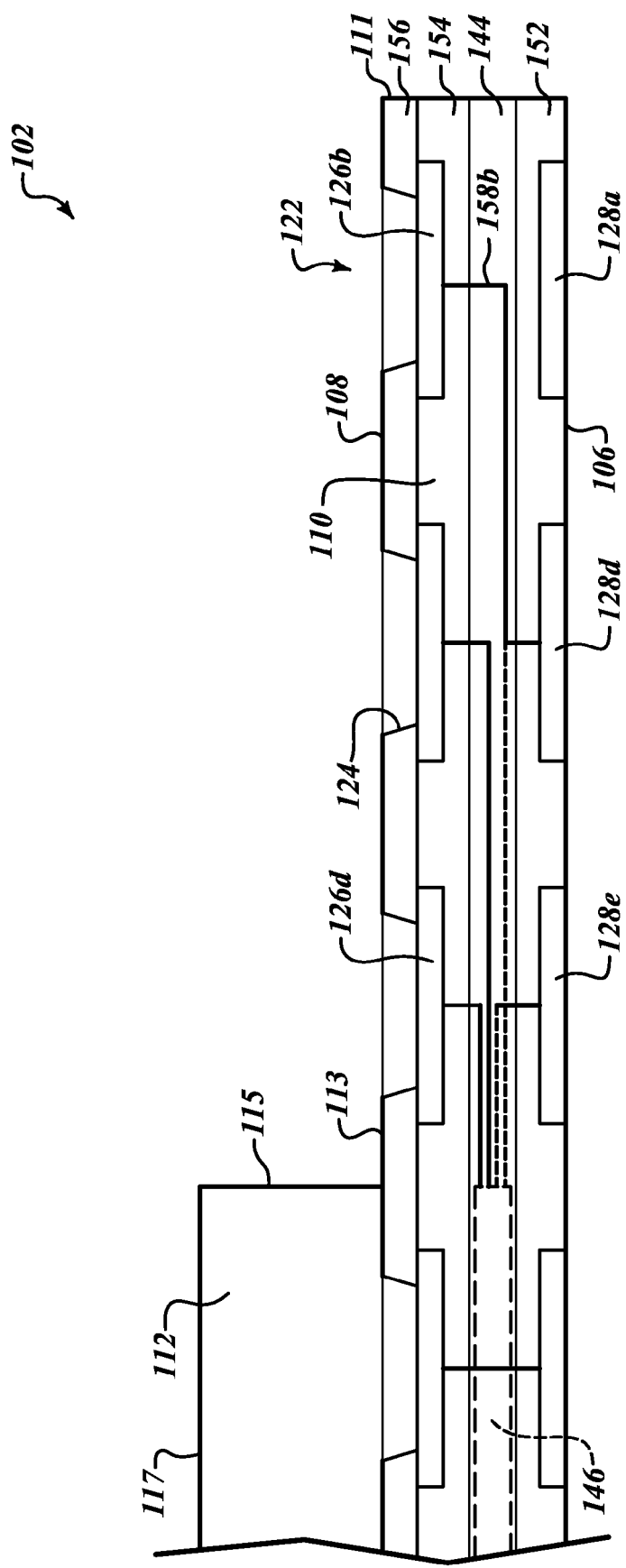

Generally, contact pads 128 in the inner region 130 may be electrically coupled to integrated circuits of the bottom semiconductor die 102 via electrical traces (see FIGS. 6A and 6B). Similarly, the contact pads 128 in the intermediary region 132 may be electrically connected to the first plurality of contact pads 126 of the upper surface 108 of the bottom semiconductor die 102 via electrical traces. The contact pads 128 in the in the intermediary region 132 may form part of an electrical path between the circuit board 90 and the upper semiconductor die 104. Some or all of the contact pads 128 in the inner region 130 may be electrically coupled to the contact pads 126 of the upper surface 108 of the bottom semiconductor die 102 and that some or all of the contact pads 128 in the in the intermediary region 132 may be electrically coupled to integrated circuits of the bottom semiconductor die 102.

Some of the contact pads are electrically isolated from integrated circuitry of the bottom semiconductor die 102 and from the contact pads 126. These electrically isolated contact pads are referenced as 128a and may be referred to as "dummy contact pads". The dummy contact pads 128a are generally located in the peripheral region 134 and may be used to receive "dummy balls."

Typically, dummy contact pads 128a are located at least at a periphery of the bottom semiconductor die 102. The dummy contact pads 128a may be located where electrically conductive balls 120 or dummy balls 120a are subject to higher than normal amounts of stress from deformations of the circuit board 90. For example, when the circuit board 90 is dropped, the circuit board 90 may undergo the greatest amount of deformation proximal to corners 140 of the bottom semiconductor die 102, and consequently, dummy contact pads 128a may be located in the corners 140.

In some embodiments, contact pads 128 that are located in the peripheral region 134 may have a different spacing or pitch from contact pads 128 in the inner region 130 and the intermediary region 132. In some embodiments, locations for dummy contact pads 128a in the peripheral region 134 may be regularly or evenly spaced in at least one direction. In some embodiments, contact pads 128 located in the peripheral region 134 may be spaced in a non-regular manner.

Figure 5:
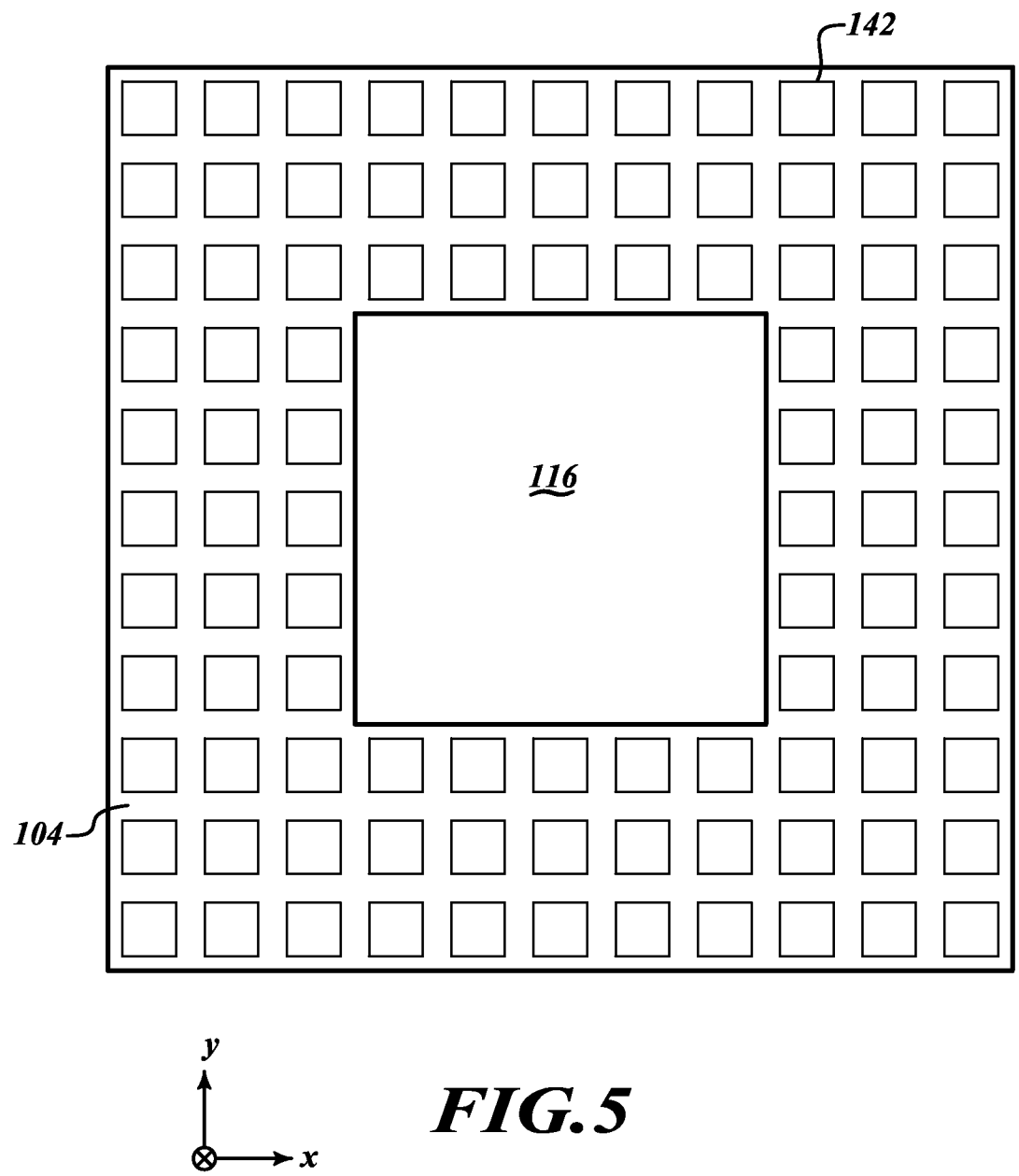
FIG. 5 is a bottom view of an upper semiconductor die of the multi-stack semiconductor dice assembly of FIG. 1A, according to one embodiment.

FIG. 5 shows a bottom view of the upper semiconductor die 104. The bottom surface 116 of the upper semiconductor die 104 includes a plurality of contact pads 142. The contact pads 142 are arranged to align with contact pads 126 of the upper surface 108 of the bottom semiconductor die 102. Some or all of the contact pads 142 are electrically coupled to integrated circuits of the upper semiconductor die 104.

FIGS. 6A and 6B shows schematic cross sectional views of the bottom semiconductor die 102.

The bottom semiconductor die 104 is formed from a single silicon wafer (see FIGS. 7A-7G) such that the base region 110 and the stepped region 112 are a single body. The stepped region 112 may be formed from the substrate of the silicon wafer by removing material above the base region 110 from a backside of a silicon wafer.

The base region 110 includes active region 144 which may be comprised of a number of layers of semiconductor materials (not shown) including electrically conductive materials such as metals, semiconducting materials such a doped silicon, and insulating materials such as silicon nitride, silicon dioxide, etc. The active region 144 includes integrated circuitry 146 which may be located beneath the stepped region 112 and which may include transistors, diodes, switches, memory cells and other components fabricated using semiconductor fabrication techniques. The active region 144 extends between a first face 148 and an opposed second face 150.

A first passivation layer 152 is disposed on the first face 148 of the active region 146. The passivation layer 152 may be a material such as silicon nitride, silicon dioxide, etc. The contact pads 128 are formed in the first passivation layer 144 such that at least a portion of the contact pads are exposed from the bottom surface 106 of the bottom semiconductor die 102.

A second passivation layer 154 interposes a substrate layer 156 and the second face 150 of the active region 146. The second passivation layer 154 may be a material such as silicon nitride, silicon dioxide, etc. The contact pads 126 are formed in the second passivation layer 154. The substrate layer 156 may be remaining silicon wafer material that was not removed in forming the stepped region 112.

Electrical traces 158 electrically couple contact pads 126 of the upper surface 113 of the base region 110 to contact pads 128 of the bottom surface 106. Some of the electrical traces 158 extend between closest pairs of contact pads 126 and 128 such as contact pads 126c and 128c. Other electrical traces 158 electrically couple pairs of contact pads 126 and 128 that are not closest pairs. For example, contact pad 126a and left hand side contact pad 128a are nearest pairs, but contact pad 126a is electrically coupled to the contact pad 128b via the electrical trace 158a in the illustrated embodiment.

In the illustrated embodiment, extreme right hand side and extreme left hand side contact pads 128a are located proximal to the outer peripheral wall 111 and are dummy contact pads.

In the illustrated embodiment, electrical trace 158b extends between contact pad 126b (extreme right hand side) and contact pad 128d and extends to the integrated circuitry 146. Thus, the bottom semiconductor die 102 and the upper semiconductor die 104 may both utilize the contact pad 128d. The contact pad 128d may be, among other things, a source pin (e.g., power source or current source) or a ground pin.

Some contact pads 128 of the bottom surface 106 such as contact pad 128e are electrically coupled to the integrated circuitry 146 and are not directly connected to contact pads 126.

Similarly, some contact pads 126 of the upper surface 108 such as contact pad 126d are electrically coupled to the integrated circuitry 146 and are not directly connected to contact pads 128.

FIGS. 7A-7G show a process for manufacturing a multi-stack semiconductor dice assembly according to one illustrated embodiment.

Figure 7A:
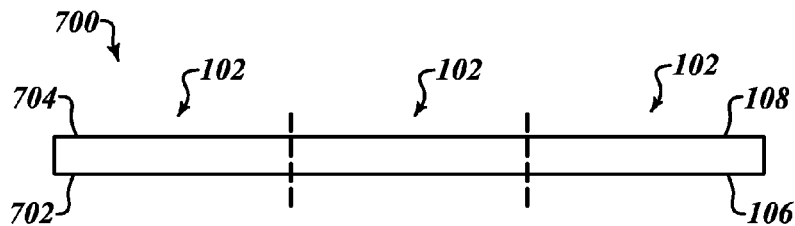
FIGS. 7A-7G show a process for manufacturing a multi-stack semiconductor dice assembly according to one illustrated embodiment.

In FIG. 7A, a semiconductor wafer 700 having a plurality of bottom semiconductor dice 102 is manufactured in accordance with the described embodiments of the bottom semiconductor die 102. The wafer 700 has an active face 702 and a non-active face 704, which correspond to the bottom surface 106 and upper surface 108 for semiconductor dice 102, respectively. The non-active face 704 is a backside of a silicon substrate.

Figure 7B:
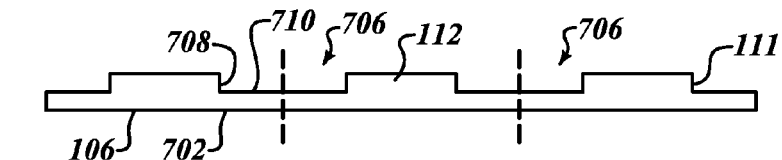

In FIG. 7B, recesses 706 are formed in the non-active face 704. The recesses 706 may be formed by conventional semiconductor processing techniques such as etching, backgrinding, sawing, cutting, laser cutting, etc. A recess 706 has a side wall 708, which corresponds to outer wall 111 of the stepped region 112, and a bottom wall 710, which corresponds to upper surface 113 of the base region 110. Stepped regions 112 are formed from the removal of material to form the recesses 706 forms. The recesses 706 may be formed by removing semiconductor wafer material to a depth of $h_2$, the thickness of the stepped region 112. In some embodiments, up to half the thickness of the semiconductor wafer 700 may be removed by formation of recesses 706.

Figure 7C:
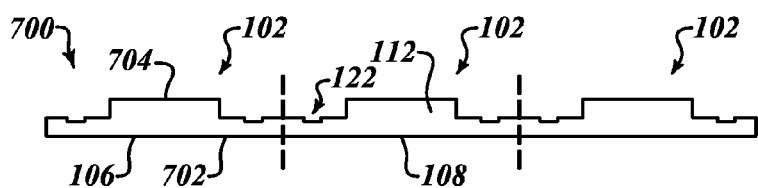

In FIG. 7C, attachment structures or attachment openings 122 are formed in the bottom wall 710 of the recesses 706. The attachment openings 122 may be formed by etching including photolithography etching or by laser drilling or by other conventional semiconductor processing techniques. The attachment openings 122 extend downward into the wafer to the plurality of contact pads 126. The depth of the attachment openings may be approximately 20 microns. Laser drilling the attachment openings 122 may result in the sidewall 124 being chamfered.

Figure 7D:
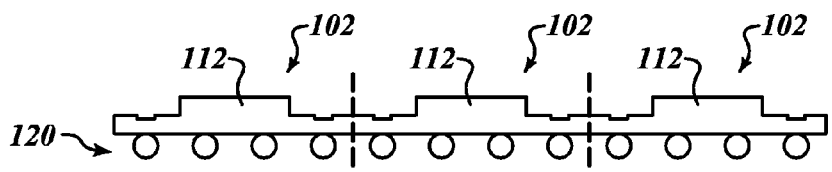

In FIG. 7D, electrically conductive balls 120 are mounted to the active face 702, which forms the bottom surface 106 of the bottom semiconductor die 102. Typically, the electrically conductive balls 120 are mounted after the wafer 702 has been through a cleaning process to remove foreign material. The electrically conductive balls 120 may be mounted by a reflow solder process.

Figure 7E:
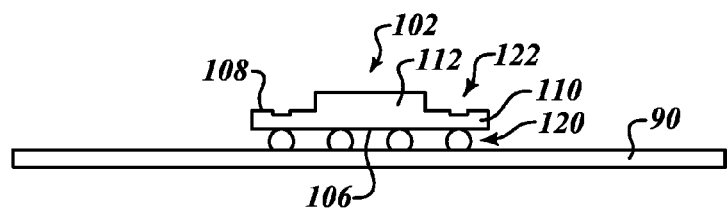

In FIG. 7E, after the bottom semiconductor dice 102 are singulated from the wafer 700, individual bottom semiconductor dice 102 are picked and placed on a circuit board 90.

Figure 7F:
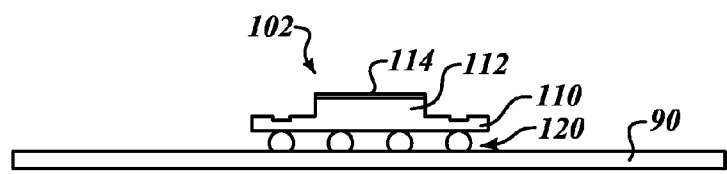

In FIG. 7F, the thermal interface material 114 is applied to the upper surface 117 of the stepped region 112.

Figure 7G:
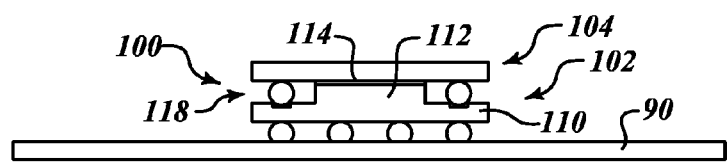

In FIG. 7G, the upper semiconductor die 104 is picked and placed onto the bottom semiconductor die 102. The upper semiconductor die may be a conventional flip-chip bumped die fabricated by conventional semiconductor processing techniques. After the upper semiconductor die 104 is stacked on the bottom semiconductor die 102, the electrically conductive balls 118 and 120 may be solder reflowed so that the bottom semiconductor die 102 is attached to the circuit board 90 and that the upper semiconductor die 104 is attached to the bottom semiconductor die 102.

FIGS. 8A-8F show a process for manufacturing a multi-stack semiconductor dice assembly 100 according to one illustrated embodiment.

Figure 8A:
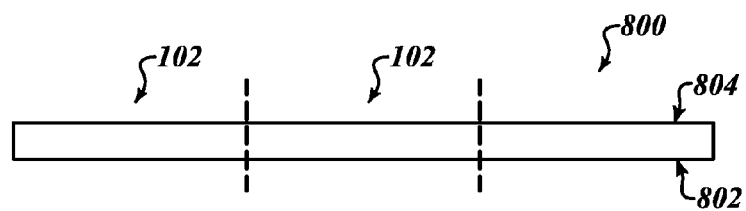
FIGS. 8A-8F show a process for manufacturing a multi-stack semiconductor dice assembly, according to one illustrated embodiment.

In FIG. 8A, a semiconductor wafer 800 having a plurality of bottom semiconductor dice 102 is manufactured in accordance with the described embodiments of the bottom semiconductor die 102. The wafer 800 has an active face 802 and a non-active face 804, which correspond to the bottom surface 106 and upper surface 108 for semiconductor dice 102, respectively. The non-active face 804 is a backside of a silicon substrate.

Figure 8B:
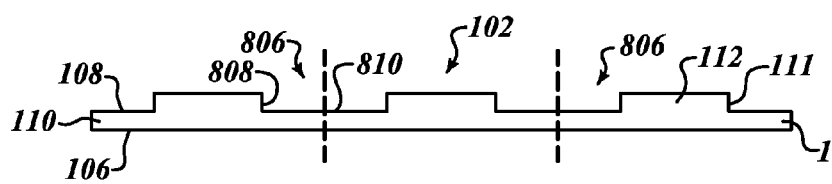

In FIG. 8B, recesses 806 are formed in the non-active face 804. The recesses 806 may be formed by conventional semiconductor processing techniques such as etching, backgrinding, sawing, cutting, laser cutting, etc. A recess 806 has a side wall 808, which corresponds to outer wall 111 of the stepped region 112, and a bottom wall 810, which corresponds to upper surface 113 of the base region 110. Stepped regions 112 are formed from the removal of material to form the recesses 806 forms. The recesses 806 may be formed by removing semiconductor wafer material to a depth of $h_2$, the thickness of the stepped region 112. In some embodiments, up to half the thickness of the semiconductor wafer 802 may be removed by formation of recesses 806.

Figure 8C:
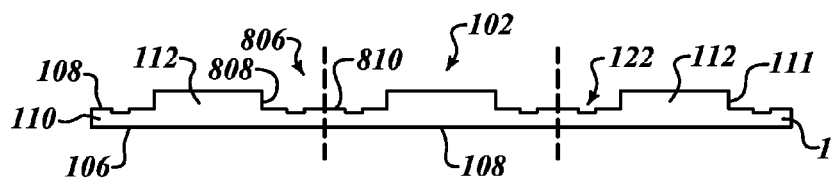

In FIG. 8C, attachment structures or attachment openings 122 are formed in the bottom wall 810 of the recesses 806. The attachment openings 122 may be formed by etching including photolithography etching or by laser drilling or by other conventional semiconductor processing techniques. The attachment openings 122 extend downward into the wafer to the plurality of contact pads 126. The depth of the attachment openings may be approximately 20 microns. Laser drilling the attachment openings 122 may result in the sidewall 124 being chamfered.

Figure 8D:
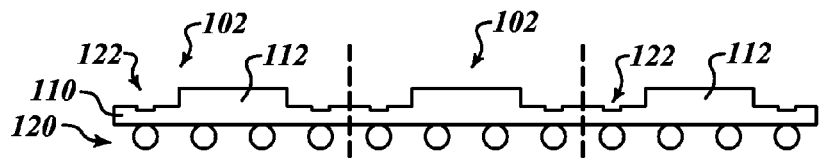

In FIG. 8D, electrically conductive balls 120 are mounted to the active face 802, which forms the bottom surface 106 of the bottom semiconductor die 102. Typically, the electrically conductive balls 120 are mounted after the wafer 800 has been through a cleaning process to remove foreign material. The electrically conductive balls 120 may be mounted by a reflow solder process.

Figure 8E:
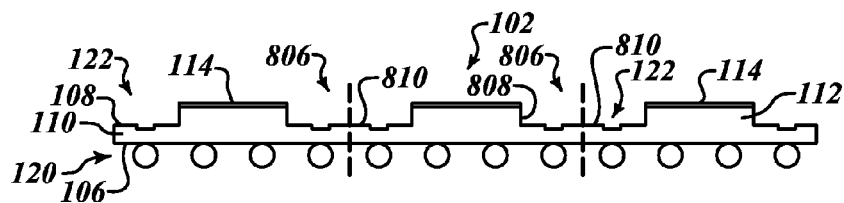

In FIG. 8E, the thermal interface material 114 is applied to the upper surface 117 of the stepped region 112 of each of the bottom semiconductor dice 102, prior to the bottom semiconductor dice 102 being singulated from the wafer 802.

Figure 8F:
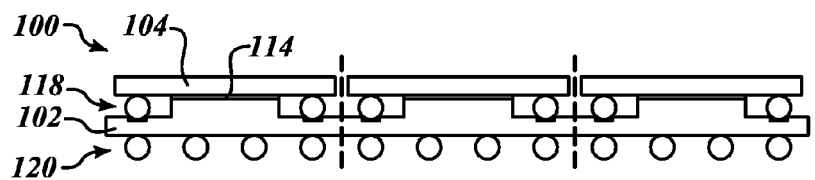

In FIG. 8F, upper semiconductor dice 104 are picked and placed onto bottom semiconductor dice 102, prior to the bottom semiconductor dice 102 being singulated from the wafer 802. The upper semiconductor dice may be conventional flip-chip bumped dice fabricated by conventional semiconductor processing techniques. After the upper semiconductor dice 104 are stacked on the bottom semiconductor dice 102, the electrically conductive balls 118 may be solder reflowed so that the bottom semiconductor dice 102 and the upper semiconductor dice 104 are attached together and form a plurality of multi-stack semiconductor dice assembly assemblies 100. The individual multi-stack semiconductor dice assembly assemblies 100 may then be singulated from the wafer 802.

Figure 9:
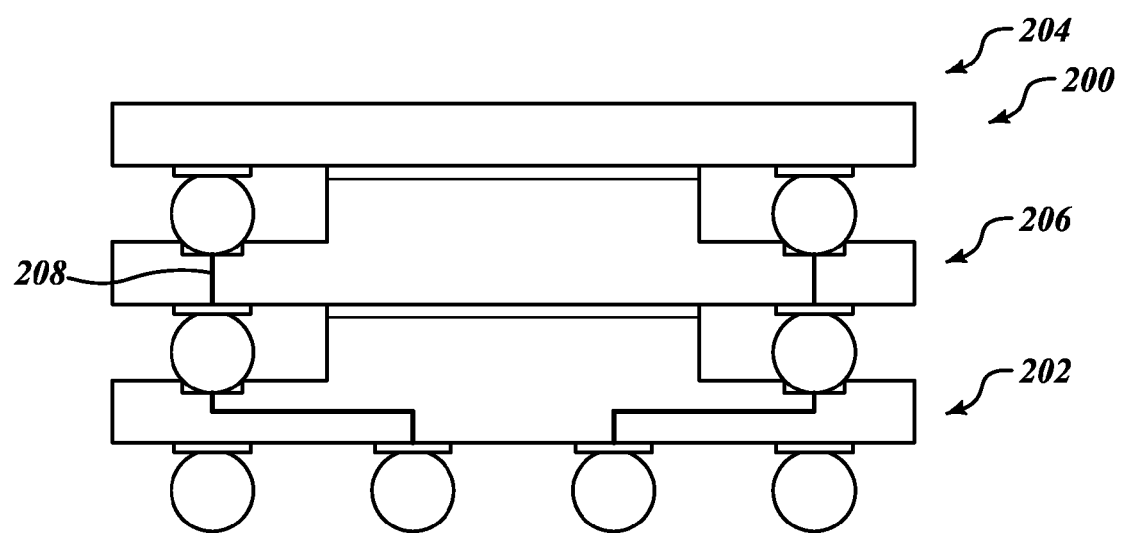
FIG. 9 is a schematic side view of a three level multi-stack semiconductor dice assembly, according to one illustrated embodiment.

FIG. 9 shows a schematic side view of a three level multi-stack semiconductor dice assembly 200. The three level multi-stack semiconductor dice assembly 200 includes a bottom semiconductor die 202 and an upper semiconductor die 204 with an intermediary semiconductor die 206 interposed therebetween. The bottom semiconductor die 202 may be a previously described bottom semiconductor die 102 of the multi-stack semiconductor dice assembly 100. The upper semiconductor die 204 may be a conventional flip-chip similar to upper semiconductor die 102.

The intermediary semiconductor die 206 may be similar to bottom semiconductor die 102 of the multi-stack semiconductor dice assembly 100. The intermediary semiconductor die 206 is electrically coupled to the bottom semiconductor die 202 and the upper semiconductor die 204. The intermediary semiconductor die 206 includes integrated circuitry (not shown) and electrical traces 208. The bottom semiconductor die 202 and the upper semiconductor die 204 may be electrically coupled via the integrated circuitry of the intermediary semiconductor die 206. Similarly, the bottom semiconductor die 202 and the upper semiconductor die 204 may be electrically coupled via the electrical traces 208 and bypassing the integrated circuitry of the intermediary semiconductor die 206.

In some embodiments, a multi-stack semiconductor dice assembly may include more than three semiconductor dies stacked one on top of the other in accordance with the above disclosure.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A multi-stack semiconductor dice assembly, comprising:
   a first semiconductor die having at least one integrated circuit therein, the first semiconductor die having an upper and a bottom surface, the bottom surface having a first plurality of contact pads thereon;
   a second semiconductor die having a bottom surface and an upper surface, the upper surface including a first semiconductor region and a second semiconductor region, the second semiconductor region being raised with respect to the first semiconductor region, the first semiconductor region having a first plurality of attachment structures, the second semiconductor die having at least one integrated circuit therein;
   a first plurality of electrically conductive balls, each electrically conductive ball of the first plurality of electrically conductive balls extending between and adhered to a respective contact pad of the bottom surface of the first semiconductor die and a respective attachment structure of the first semiconductor region of the second semiconductor die;
   a first plurality of contact pads on the bottom surface of the second semiconductor die; and
   a second plurality of contact pads on the bottom surface of the second semiconductor die at least partially circumscribing the first plurality of contact pads on the bottom surface of the second semiconductor die, wherein each contact pad of the second plurality of contact pads on the bottom surface of the second semiconductor die is electrically isolated from the at least one integrated circuit of the second semiconductor die.

2. A multi-stack semiconductor dice assembly comprising:
   a first semiconductor die having at least one integrated circuit therein, the first semiconductor die having an upper and a bottom surface, the bottom surface having a first plurality of contact pads thereon;
   a second semiconductor die having a bottom surface and an upper surface, the upper surface including a first semiconductor region and a second semiconductor region, the second semiconductor region being raised with respect to the first semiconductor region, the first semiconductor region having a first plurality of attachment structures, the second semiconductor die having at least one integrated circuit therein;
   a first plurality of electrically conductive balls, each electrically conductive ball of the first plurality of electrically conductive balls extending between and adhered to a respective contact pad of the bottom surface of the first semiconductor die and a respective attachment structure of the first semiconductor region of the second semiconductor die
   a first plurality of contact pads on the bottom surface of the second semiconductor die;
   a first plurality of electrical paths, wherein each contact pad of the first plurality of contact pads on the bottom surface of the second semiconductor die is electrically coupled to a respective attachment structure of the first plurality of attachment structures of the first semiconductor region of the second semiconductor die; and
   a second plurality of contact pads on the bottom surface of the second semiconductor die at least partially circumscribing the first plurality of contact pads on the bottom surface of the second semiconductor die, wherein each contact pad of the second plurality of contact pads on the bottom surface of the second semiconductor die is electrically isolated from the at least one integrated circuit of the second semiconductor die.

3. The multi-stack semiconductor dice assembly of claim 2 wherein the second semiconductor die further includes:
   a third plurality of contact pads on the bottom surface of the second semiconductor die at least partially circumscribed by the second plurality of contact pads on the bottom surface of the second semiconductor die, each contact pad of the third plurality of contact pads being electrically coupled to a respective integrated circuit of the second semiconductor region of the second semiconductor die.

4. The multi-stack semiconductor dice assembly of claim 1 wherein the first semiconductor die has at least one circumscribing side edge defining an outer periphery of the first semiconductor die that extends between the opposed upper and bottom surfaces of the first semiconductor die, wherein the second semiconductor die has at least one circumscribing side edge defining an outer periphery of the second semiconductor die, and wherein the respective outer peripheries of the first and second semiconductor dies are generally aligned with the first semiconductor die stacked above the second semiconductor die.

5. The multi-stack semiconductor dice assembly of claim 4 wherein the second semiconductor region of the second semiconductor die is located generally beneath the first semiconductor die and within the outer periphery of the second semiconductor die.

6. The multi-stack semiconductor dice assembly of claim 1 wherein the second semiconductor region of the second semiconductor die is free of attachment structures, and the first semiconductor region of the second semiconductor die is free of integrated circuits.

7. The multi-stack semiconductor dice assembly of claim 1 wherein each attachment structure defines an opening in the first semiconductor region of the second semiconductor die.

8. The multi-stack semiconductor dice assembly of claim 7 wherein the attachment structures include contact pads that are at least partially exposed by the respective openings of the attachment structures, wherein the first plurality of electrically conductive balls are adhered to the contact pads of the attachment structures.

9. The multi-stack semiconductor dice assembly of claim 7 wherein the second semiconductor die is integrally formed from a silicon wafer.

10. The multi-stack semiconductor dice assembly of claim 9 wherein material of the silicon wafer is removed from above the first semiconductor region of the second semiconductor die such that the second semiconductor region is raised with respect to the first semiconductor region.

11. The multi-stack semiconductor dice assembly of claim 1, further including:
a thermal interface material extending between a portion of the bottom surface of the first semiconductor die and the second semiconductor region of the second semiconductor die.

12. The multi-stack semiconductor dice assembly of claim 1 wherein the first semiconductor region of the upper surface of the second die surrounds the perimeter of the second semiconductor region.

13. The multi-stack semiconductor dice assembly of claim 1 wherein first semiconductor region is integral with the second semiconductor region.

14. The multi-stack semiconductor dice assembly of claim 1 wherein a junction between the first semiconductor region and the second semiconductor region of the upper surface of the second die forms a wall that is substantially orthogonal to the first and second semiconductor regions.

15. A multi-stack semiconductor dice assembly comprising:
a first semiconductor die that includes at least one integrated circuit, the first semiconductor die having an upper surface and a bottom surface, the bottom surface having a first plurality of contact pads thereon;
a second semiconductor die having a bottom surface and an upper surface, the upper surface having a raised portion and a base portion, wherein a first thickness of the semiconductor die between the bottom surface and the upper surface at the raised portion is greater than a second thickness of the semiconductor dice between the bottom surface and the upper surface at the base portion, the base portion having a first plurality of attachment structures, the second semiconductor die having at least one integrated circuit therein;
a plurality of electrically conductive balls, each electrically conductive ball of the plurality of electrically conductive balls extending between and adhered to a respective contact pad of the bottom surface of the first semiconductor die and a respective attachment structure on the base portion of the second semiconductor die; and
a first plurality of contact pads on the bottom surface of the second semiconductor die; and
a second plurality of contact pads on the bottom surface of the second semiconductor die at least partially circumscribing the first plurality of contact pads on the bottom surface of the second semiconductor die, wherein each contact pad of the second plurality of contact pads on the bottom surface of the second semiconductor die is electrically isolated from the at least one integrated circuit of the second semiconductor die.

16. The multi-stack semiconductor dice assembly of claim 15 wherein the raised portion is a raised center portion and the base portion extend around the raised center portion.

17. The multi-stack semiconductor dice assembly of claim 15 wherein the second semiconductor die has the at least one integrated circuit located in the upper surface and confined within a boundary defined by the raised portion.

18. The multi-stack semiconductor dice assembly of claim 15 wherein a thermal interface material is located between the bottom surface of the first semiconductor die and the upper surface of the second semiconductor die at the raised region.

19. The multi-stack semiconductor dice assembly of claim 15 further comprising a first plurality of electrical paths, wherein each contact pad of the first plurality of contact pads on the bottom surface of the second semiconductor die is electrically coupled to a respective attachment structure of the first plurality of attachment structures of the base portion of the second semiconductor die.

\* \* \* \* \*